United States Patent [19]

Pankove et al.

[11] 3,740,622

[45] June 19, 1973

[54] ELECTROLUMINESCENT SEMICONDUCTOR DEVICE FOR GENERATING ULTRA VIOLET RADIATION

[75] Inventors: Jacques Isaac Pankove; Peter Edward Norris, both of Princeton, N.J.

[73] Assignee: RCA Corporation, New York, N.Y.

[22] Filed: July 10, 1972

[21] Appl. No.: 270,220

[52] U.S. Cl. ........................ 317/235 R, 317/235 N

[51] Int. Cl. ............................................ H01l 3/00

[58] Field of Search .................................. 317/235

[56] References Cited

UNITED STATES PATENTS

| | | | |
|---|---|---|---|
| 3,683,240 | 8/1972 | Pankove | 317/234 |
| 3,492,548 | 1/1970 | Goodman | 317/234 |
| 3,623,026 | 11/1971 | Engeler et al. | 340/173 |
| 3,646,406 | 2/1972 | Logan et al. | 317/234 |

*Primary Examiner*—John W. Huckert
*Assistant Examiner*—E. Wojciechowicz
*Attorney*—Glenn H. Bruestle and Donald S. Cohen

[57] ABSTRACT

An electroluminescent semiconductor device including a body of crystalline gallium nitride, a layer of silicon nitride on a surface of the body, a metal layer on the silicon nitride layer and an ohmic metal contact on the body. When a bias is applied between the metal layer and the contact which with respect to the ohmic contact is first negative and then positive, ultra violet radiation will be emitted from the body.

6 Claims, 2 Drawing Figures

ELECTROLUMINESCENT SEMICONDUCTOR DEVICE FOR GENERATING ULTRA VIOLET RADIATION

BACKGROUND OF THE INVENTION

The present invention relates to an electroluminescent semiconductor device which will generate and emit radiation in the ultra violet range of the spectrum; and more particularly to such an electroluminescent device in which the active material is a body of crystalline gallium nitride.

Electroluminescent semiconductor devices in general are bodies of a crystalline semiconductor material which when biased emit light, either visible or infrared, through the recombination of pairs of oppositely charged carriers. The wavelength of the emitted light is determined by the band gap energy of the semiconductor material used. Such electroluminescent semiconductor devices have been made of the group III–V compound semiconductor materials, such as the phosphides, arsenides, antimonides and nitrides of aluminum, gallium and indium, and combinations of these materials because the high band gap energy of these materials allows emission of visible and near infrared radiation. For example, gallium arsenide emits infrared radiation. Gallium aluminum arsenide will emit either infrared or yellow radiation depending on the amount of aluminum in the material. Gallium phosphide will emit either red or green light. Gallium nitride has been found to be capable of emitting either blue or green light. Although electroluminescent semiconductor devices which emit radiation of various wavelengths have been made using various semiconductor materials, heretofore an electroluminescent semiconductor device which emitted ultra-violet radiation was not available.

SUMMARY OF THE INVENTION

An electroluminescent semiconductor device including a body of crystalline gallium nitride having on a surface thereof a layer of an electrically insulating nitride. An electrically conductive layer is on the nitride layer and an electrically conductive contact is in ohmic engagement with the gallium nitride body. A bias is applied between the conductive layer and the contact to generate in the gallium nitride body ultra violet radiation.

DETAILED DESCRIPTION

Figure 1:
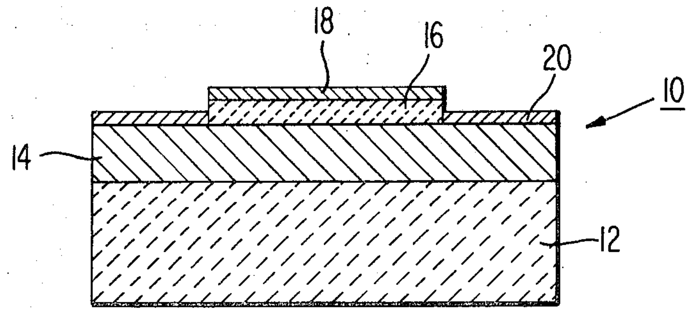
FIG. 1 is a sectional view of one form of the electroluminescent semiconductor device of the present invention.

Referring initially to FIG. 1, one form of the electroluminescent semiconductor device of the present invention is generally designated as 10. The electroluminescent semiconductor device 10 comprises a substrate 12 of an electrically insulating material which is preferably optically transparent, such as sapphire. A body 14 of crystalline gallium nitride is on the surface of the substrate 12. A layer 16 of an electrically insulating material is on a portion of the surface of the gallium nitride body 14 and serves as a gate insulation. The insulating layer 16 is preferably of a nitride, such as silicon nitride and is preferably of a thickness of 700 to 1000 Angstroms. A layer 18 of of an electrically conductive metal, such as aluminum, is on the insulating layer 16 and serves as the gate contact. A layer 20 of an electrically conductive metal, such as aluminum, is on the surface of the gallium nitride body 14 and forms an ohmic contact therewith.

The electroluminescent semiconductor device 10 may be made by epitaxially depositing the gallium nitride body 14 on the substrate 12, such as by the vapor phase epitaxy technique described in the article "The Preparation and Properties of Vapor-Deposited Single-Crystalline GaN" by H. P. Maruska and J. J. Tietjen published in APPLIED PHYSICS LETTERS, Volume 15, page 327 (1969). The gallium nitride body 14 so deposited will inherently be of N type conductivity. A silicon nitride insulating layer 16 can be deposited on the gallium nitride body 14 by placing the substrate 12 having the gallium nitride body 14 thereon in a chamber through which is passed a gas containing silicon and nitrogen, such as a mixture of silane and ammonia. The gas is heated to a temperature, of about 700°C, at which the gas reacts to form the silicon nitride which deposits on the surface of the gallium nitride body 14. The use of a nitride for the insulating layer 16 is preferred since, at the temperature used to deposit an insulating layer on the gallium nitride body 14, the gallium nitride at the surface of the body may decompose. However, when depositing a nitride insulating layer, the atmosphere around the gallium nitride body 14 contains amnonia which prevents the decomposition of the gallium nitride body. To define the area of the insulating layer 16, a masking layer may be first applied to the surface of the gallium nitride body 14 with the masking layer having an opening there-through over the area of the body to which the insulating layer is to be applied. The insulating layer is then deposited on the exposed area of the surface of the body 14 and the masking layer is then removed. Alternatively, the insulating layer may be deposited over the entire surface of the body 14. A masking layer is then coated on the area of the insulating layer to be retained and the uncovered portion of the insulating layer is then removed by etching with a suitable etchant, such as hot phosphoric acid. The metal layers 18 and 20 may be applied by the well known technique of evaporating the metal in a vacuum and depositing the metal on the insulating layer 16 and gallium nitride body 14 respectively.

To operate the electroluminescent semiconductor device 10, the gate contact 18 and the ohmic contact 20 are connected across a source of electrical energy. Bipolar pulses of voltage are applied to the gate contact 18 each one of which is first negative with respect to the ohmic contact 20 and then is positive with respect to the ohmic contact. Although the pulses are preferably square wave pulses, pulses of other shapes can be used as long as there is a rapid change from negative to positive. The initial negative gate voltage of each pulse creates an inversion layer, at the interface between the gallium nitride body 14 and the gate insulating layer 16. The inversion layer traps holes at the interface. The following positive voltage portion of each pulse injects the holes from the surface layer into the electron rich bulk where electron-hole recombination generates light. In the electroluminescent semiconductor device 10, the light so generated is in the ultra violet range of the spectrum and can be emitted through the transparent substrate 12.

Figure 2:
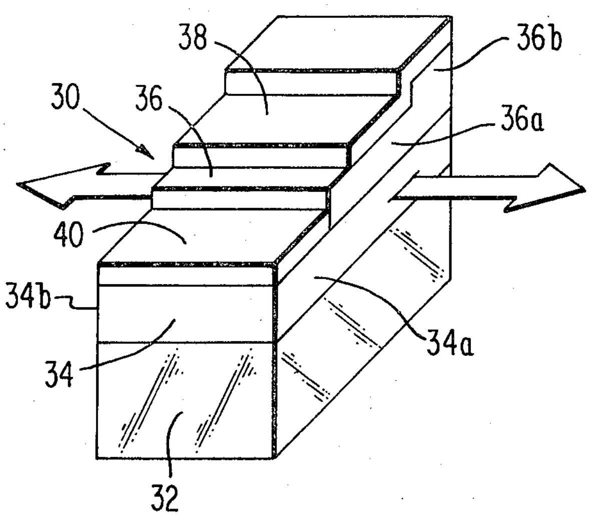
FIG. 2 is a perspective view of the elctroluminescent semiconductor device of the present invention in the form of a laser.

Referring to FIG. 2, another form of the electroluminescent semiconductor device of the present invention is generally designated as 30. The electroluminescent semiconductor device 30 comprises a substrate 32 of an electrically insulating material, such as sapphire. A body 34 of crystalline gallium nitride is on the top surface of the substrate 32. The gallium nitride body 34 has opposed sides 34*a* and 34*b* which are planar and parallel to form a Fabry-Perot cavity. Also, the body sides 34*a* and 34*b* are preferably highly polished. A layer 36 of an electrical insulating material, preferably a nitride such as silicon nitride, is on a portion of the surface of the gallium nitride body 34 and extends between the parallel sides 34*a* and 34*b* of the body. One portion 36*a* of the insulating layer 36 is of a thickness of 700 to 1000 Angstroms and serves as the gate insulation. The remaining portion 36*b* of the insulating layer is thicker than the gate insulation portion 36*a*. A layer 38 of an electrically conductive metal, such as aluminum, is on the insulating layer 36 and serves as the gate contact. A layer 40 of an electrically conductive metal, such as aluminum, is on the surface of the gallium nitride body 34 and forms an ohmic contact with the body. The electroluminescent semiconductor device 30 can be made in a manner as previously described with regard to the electroluminescent semiconductor device 10 of FIG. 1.

The electroluminescent semiconductor device 30 is operated in the same manner as previously described with regard to the operation of the electroluminescent semiconductor device 10 of FIG. 1. The gate contact 38 and the ohmic contact 40 are connected across a source of electrical current. Pulses are applied to the gate contact 38 with each pulse being first negative and then positive with respect to the ohmic contact. This generates ultra violet radiation in the gallium nitride body 34 under the gate insulator 36*a*. Since the opposite sides 34*a* and 34*b* of the gallium nitride body 34 are highly polished, and the refractive index of gallium nitride is greater than that of the ambient, they are partially reflective and partially transparent. Also, since the partially reflective and partially transparent sides 34*a* and 34*b* are parallel, they form a Fabry-Perot cavity in which the light is generated. As is well known, the efficient generation of light in such a Fabry-Perot cavity will provide substantially coherent radiation which is emitted from the sides 34*a* and 34*b* as indicated by the arrows in FIG. 2. Thus, the electroluminescent semiconductor device 30 is a semiconductor laser which emits substantially coherent ultra violet radiation. As is well known in the laser art, the sides 34*a* and 34*b* of the gallium body 34 can also be made partially reflective and partially transparent by coating them with a thin film of a metal which does not contact either of the contacts 38 and 40 or with several layers of a dielectric forming a dichroic filter. By making one of the thin metal films sufficiently thick so that it is substantially completely reflective or the dielectric filter 100 percent reflective, the emission of the coherent ultra violet radiation can be limited to only one of the sides of the gallium nitride body.

Thus, there is provided by the present invention an electroluminescent semiconductor device which genrates ultra violet radiation. Also, the electroluminescent semiconductor device can be formed with a Fabry-Perot cavity so as to emit substantially coherent ultra violet radiation.

We claim:

1. An electroluminescent semiconductor device comprising
- a body of crystalline N type conductivity gallium nitride,
- a layer of an electrically insulating silicon nitride on a surface of said body,
- an electrically conductive layer on said silicon nitride layer, and
- an electrically conductive contact in ohmic engagement with said body,
- said conductive layer and said contact constituting terminal means for applying a bias therebetween to generate in said body ultra violet radiation.

2. An electroluminescent semiconductor device in accordance with claim 1 in which the insulating layer is of a thickness of 700 to 1000 Angstroms.

3. An electroluminescent semiconductor device in accordance with claim 2 in which the body is epitaxial gallium nitride on a substrate of an electrically insulating material.

4. An electroluminescent semiconductor device in accordance with claim 3 in which the substrate is of sapphire.

5. An electroluminescent semiconductor device in accordance with claim 1 in which the body has two opposed parallel sides at least one of which is partially reflective and partially transparent so as to provide a Fabry-Perot cavity.

6. An electroluminescent semiconductor device comprising
- a body of crystalline N type conductivity gallium nitride,
- a layer of an electrically insulating silicon nitride on a surface of said body,
- an electrically conductive layer on said silicon nitride layer,
- an electrically conductive contact in ohmic engagement with said body, and
- means for applying between said conductive layer and said contact bi-polar pulses of voltage each one of which is first negative with respect to said contact and then positive with respect to said contact so as to generate radiation in said body.

* * * * *